United States Patent
Kim

(10) Patent No.: US 6,434,079 B2
(45) Date of Patent: Aug. 13, 2002

(54) SEMICONDUCTOR MEMORY DEVICE FOR DISTRIBUTING LOAD OF INPUT AND OUTPUT LINES

(75) Inventor: Kang-Yong Kim, Kyoungki-Do (KR)

(73) Assignee: Hynix Semiconductor, Seoul (KR)

( * ) Notice: Subject to any disclaimer, the term of this patent is extended or adjusted under 35 U.S.C. 154(b) by 0 days.

(21) Appl. No.: 09/746,142

(22) Filed: Dec. 21, 2000

(30) Foreign Application Priority Data

Dec. 28, 1999 (KR) .............................. 99-63603

(51) Int. Cl.[7] ................................. G11C 8/00
(52) U.S. Cl. ....................... 365/230.02; 365/230.06; 365/241
(58) Field of Search ................. 365/230.03, 230.06, 365/189.02, 189.01, 203, 196, 230.02

(56) References Cited

U.S. PATENT DOCUMENTS 5,675,529 A * 10/1997 Poole ........................... 365/63
6,310,809 B1 * 10/2001 Roohparvar et al. ........ 365/203

* cited by examiner

Primary Examiner—Hoai V. Ho
Assistant Examiner—Thong Le
(74) Attorney, Agent, or Firm—Townsend and Townsend and Crew, LLP

(57) ABSTRACT

A semiconductor memory device for distributing load of input and output lines includes: a line pre-charger for pre-charging a global read line composed of a pair of lines to a high level in an initial or steady state, a plurality of memory banks connected to a global write line for storing data provided thereto, each of which includes a memory cell array composed of a number of memory cells coupled to a multiplicity of sense amplifiers and the multiplicity of write drivers, a number of multiplexers for selecting the data from the read line; and a data input multiplexer for providing externally inputted data to the global write line on the write operation.

5 Claims, 6 Drawing Sheets

SEMICONDUCTOR MEMORY DEVICE FOR DISTRIBUTING LOAD OF INPUT AND OUTPUT LINES

FIELD OF THE INVENTION

This invention relates to a semiconductor memory device; and, more particularly, to a memory device which is capable of distributing load of input/output lines and thus capable of operating in a high speed.

DESCRIPTION OF THE PRIOR ART

Recently, there have been developed high-speed semiconductor memory devices. These memories are provided with a clock signal having small period for operations. The small clock signal is needed to provide high-speed operations.

FIG. 1 is a block diagram illustrating a structure of a memory device, which shows four memory banks for illustration. As shown, a global read line GRIO and a global write line GWIO are connected to four sense amplifiers 2 and four write drivers 3 in each of the four memory banks 10, respectively.

On a read operation, the data output through the global read line GRIO is provided to outside through three multiplexers MUX1 to MUX3. Initially or in standby state, the global read line GRIO is pre-charged to a high level by a global read line pre-charge unit 20. In this case the global read line GRIO is shared by 16 sense amplifiers 2 and 3 multiplexers MUX1 to MUX3, thereby applying a very big line load to the global read line GRIO.

On the read operation, only one sense amplifier among 16 sense amplifiers 2 operates and a big line load is applied to the operating sense amplifier. Thus, the output data from the operating sense amplifier is a skewed signal having a small slope, which requires a clock signal with a large period to differentiate the output signals, thereby reducing operation speed.

There is disclosed to overcome this problem by increasing driver capability of the sense amplifiers 2 but this approach increases power consumption therein.

On the other hand, on a write operation the data inputted to a data input multiplexer DIMUX is written to a memory cell by a write driver among 4 write drivers in a memory bank. In this case the global write line GWIO is shared by 16 write drivers 3 and one data input multiplexer DIMUX, and thus very big line load is applied to the global write line GWIO. The same problems as in the read operation are occurred. That is, employing clock signal with small slope reduces operation speed, and increasing driver capability of the write driver 3 increases power consumption therein.

SUMMARY OF THE INVENTION

It is, therefore, an object of the present invention to provide a semiconductor memory device, which is capable of distributing load of input and output lines and thus capable of operating in a high speed.

In accordance with an aspect of the present invention, there is provided a semiconductor memory device for distributing load of input and output lines, comprising: a line pre-charging means for pre-charging a global read line composed of a pair of lines to a high level in an initial or steady state; a plurality of memory banks connected to a global write line composed of a pair of lines for storing data provided thereto, each of which includes a memory cell array composed of a number of memory cells coupled to a multiplicity of sense amplifiers and the multiplicity of write drivers, wherein said multiplicity of amplifiers amplifies data signals from the memory cells to provide it through a read line composed of a pair of lines to a read line driver which provides the data on said read line to said global read line on a read operation, and said multiplicity of write drivers are connected through a write line composed of a pair of lines to said write line driver for storing the data on said global write line into the memory cells; a number of multiplexers for selecting the data from said read line; and a data input means for providing externally inputted data to said global write line on the write operation.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Figure 1:
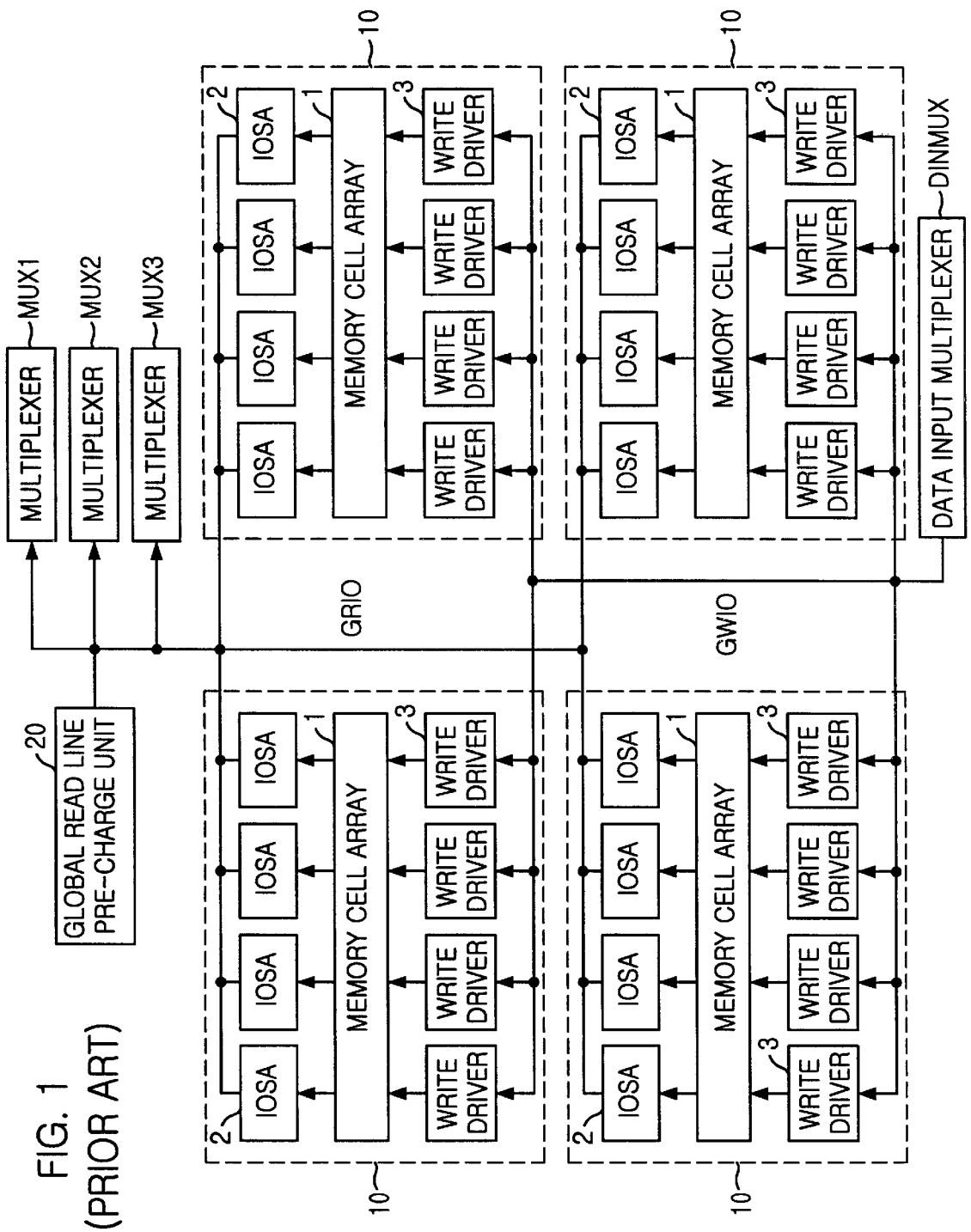
FIG. 1 is a block diagram illustrating a structure of a memory device in accordance with a prior art, which includes four memory banks for illustration.
Figure 2:
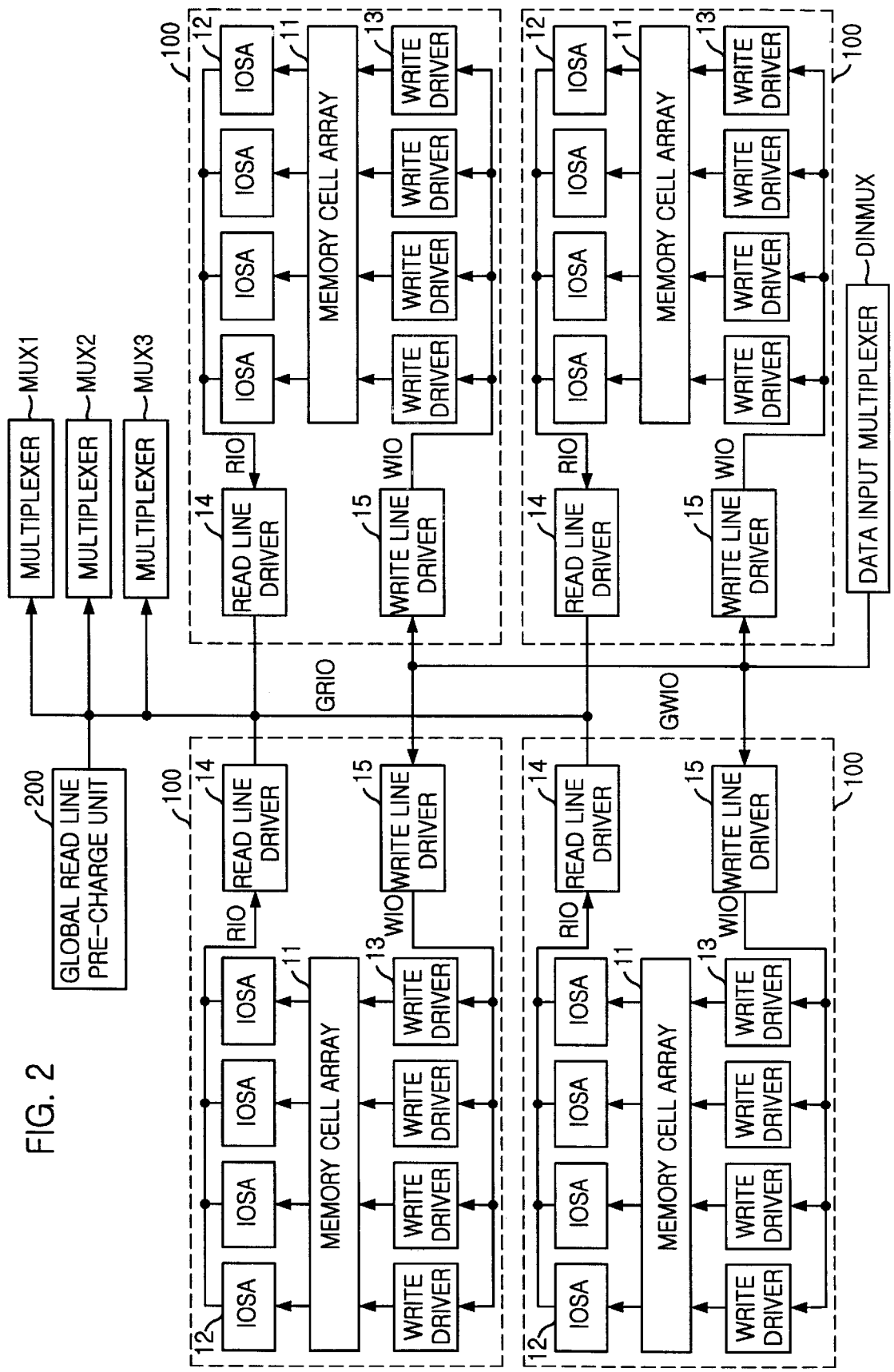
FIG. 2 presents a block diagram illustrating a structure of a memory device in accordance with an embodiment of the present invention, which includes four memory banks for illustration.

FIG. 2 illustrates a block diagram showing a structure of a memory device, which is capable of dividing the load of input and output lines on a read or a write operation in accordance with an embodiment of the present invention. For the purpose of explanation, the memory device comprises four memory banks 100 and each of which includes a memory cell array 1 composed of a number of memory cells, four sense amplifiers 12, a read line driver 14, four write drivers 13, and a write line driver 15.

The sense amplifiers 12 and the read line driver 14 in each of the memory banks 100 are connected to a read line RIO. Each memory bank can include a plurality of sense amplifiers connected to the read line RIO though only four sense amplifiers are disclosed for illustration purpose.

When a read command is issued, the data from a memory cell in a selected memory bank is amplified by a selected sense amplifier in the selected memory bank and transferred to the read line driver 14 via the read line RIO. Then, the read line driver 14 transfers the data to the multiplexers MUX1 to MUX3 through the global read line GRIO to provide the data selectively.

At this time, in an initial state or in a standby state, the global read line GRIO is pre-charged to a high by a global read line pre-charge unit 200. The read line is actually composed of a true and an inverted read lines. Similarly, the global read line consists of a true and inverted global read lines.

Figure 3A:
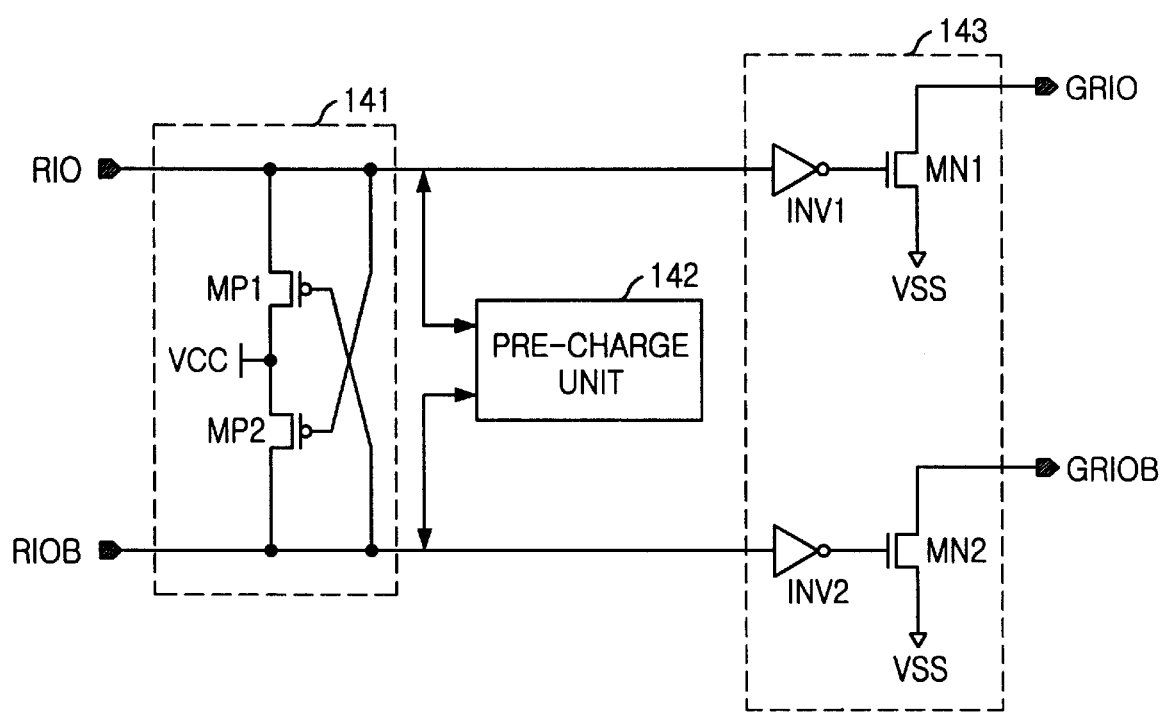
FIGS. 3A and 3B illustrate detailed diagrams of a read line driver of the memory device in accordance with an embodiment of the present invention.
Figure 3B:
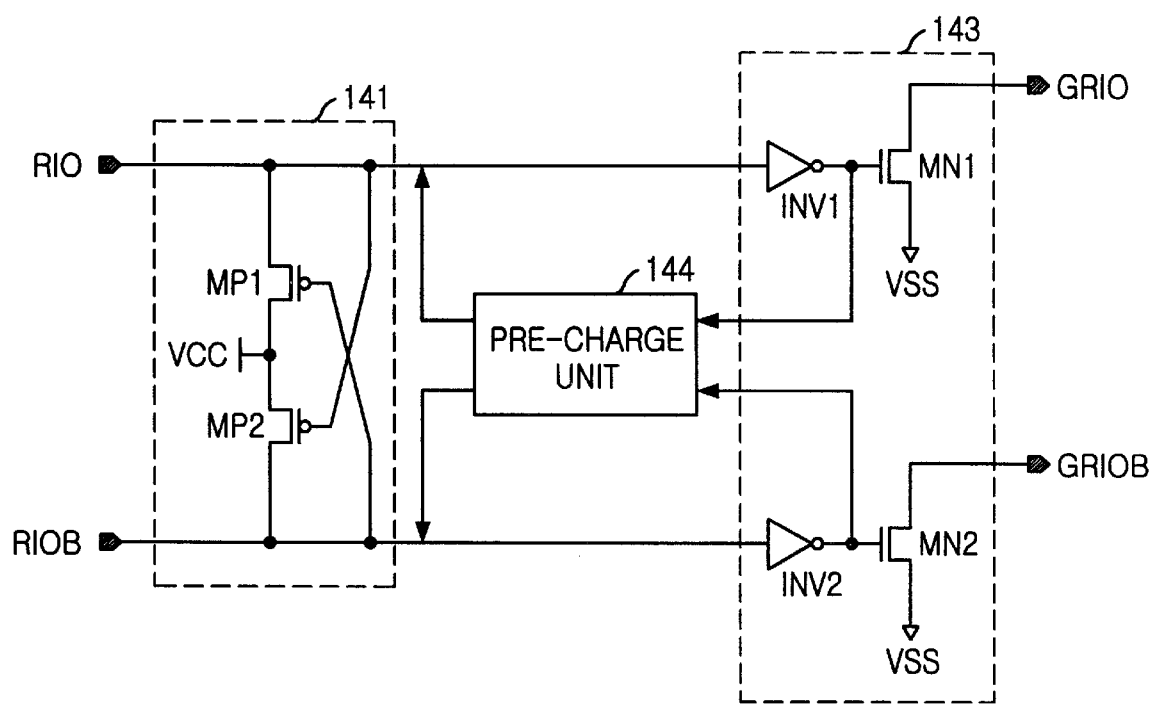
Figure 3C:
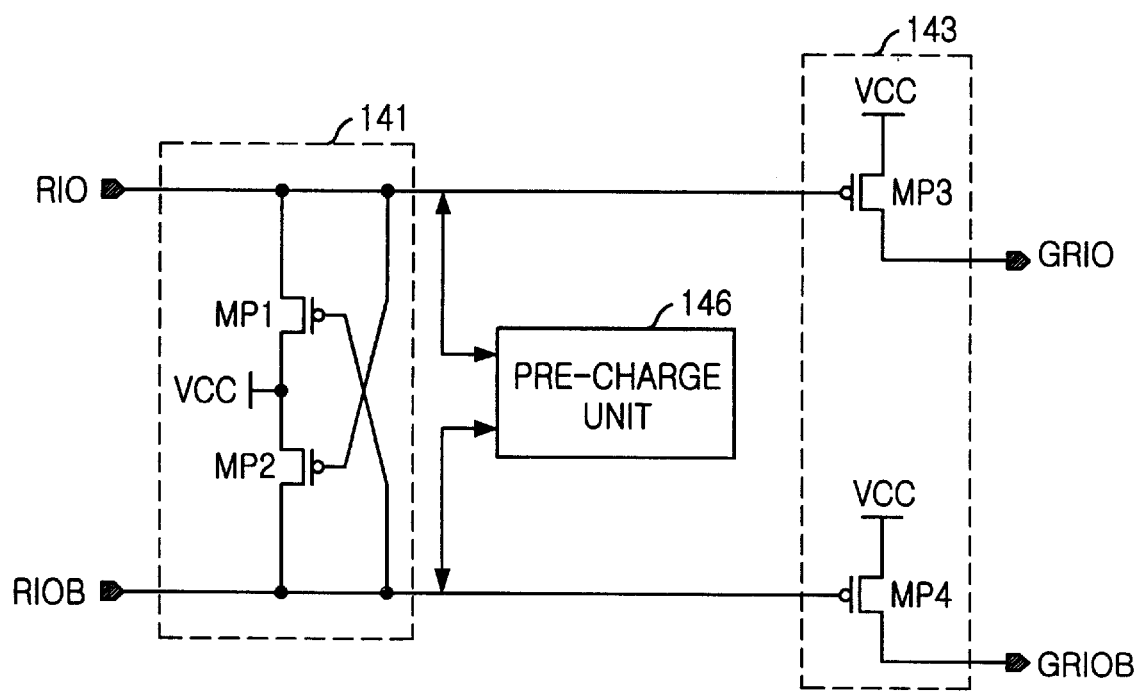
FIG. 3C illustrates a detailed diagram of the read line driver of the memory device in accordance with an another embodiment of the present invention.

FIGS. 3A to 3C illustrate a detailed diagram of the read line driver 14 of the memory device in accordance with an embodiment of the present invention.

As shown, the read line driver 14 includes a level detector 141, a pre-charge unit 142 and an output driver 143. The level detector 141 comprises a first and second pMOS transistors MP1 and MP2 that are connected together in serial. The transistor MP1 has a gate coupled to the inverted read line RIOB, and the transistor MP2 has the gate connected to the true read line RIO. Both transistors have a common node connected to a voltage source VCC. To reduce the effect of cross talk, the drain of the transistor MP1 is connected to the true read line RIO and the drain of the transistor MP2 is coupled to the inverted read line RIOB. The pre-charge unit 142 pre-charges the true and inverted read lines RIO and RIOB to a high level in initial or standby state. When data is provided to the true and inverted read lines RIO and RIOB, one of them becomes to a low level and some time later the true and inverted read lines RIO and RIOB are pre-charged to the high level again by the pre-charge unit 142. The output driver 143, which provides the data on the true and the inverted lines RIO and RIOB to the true and the inverted global read lines GRIO and GRIOB, respectively, includes inverters INV1 and INV2, and a first and second nMOS transistors MN1 and MN2. The first and second inverters INV1 and INV2 invert the levels of the true and the inverted lines RIO and RIOB, respectively. The inverters INV1 and INV2 are connected to respective nMOS transistors MN1 and MN2, which selectively provides ground voltage VSS to the true or the inverted global read lines GRIO and GRIOB.

According to the present invention, the pre-charge unit 142 (shown in FIGS. 3A and 3C) pre-charges the true and the inverted read lines RIO and RIOB by using the levels thereof. The pre-charge unit 144 (shown in FIGS. 3b) pre-charges the true and the inverted read lines RIO and RIOB through the use of output signals from the first and the second inverters INV1 and INV2.

In accordance with another embodiment of the present invention, the pMOS transistors MP1 and MP2 in the level detector 141 can be substituted by nMOS transistors, and the nMOS transistors MN1 and MN2 in the output driver 143 can be substituted by the pMOS transistors. In this case, the common node of the nMOS transistors is coupled to the ground VSS, which is used to pre-charge the read line RIO and the global read line GRIO.

In accordance with an another embodiment of the present invention, the output driver 143 can be implemented by using pMOS transistors MP3 and MP4 whose sources are coupled to the voltage source VCC as shown in FIG. 3C.

According to the present invention, since the read line driver 14 between the read line RIO and the global read line GRIO distributes the load on line to the read line RIO and the global read line GRIO, the slope of the skewed signal from the sense amplifiers 12 increased and thus the period of the clock signal decreased, thereby increasing operation speed.

When a write command is issued, data from a data input multiplexer DIMUX is provided to a global write line GWIO. Thereafter, the data on the global write line GWIO is buffered by a write line driver 15 and then stored to the memory cell through the use of the writer driver 13 selected by a write address. The write line driver 15 can be composed of one inverter to buffer the data. In this case the line load is distributed to the write line WIO and the global write line GWIO, thereby increasing the operation speed.

Figure 4:
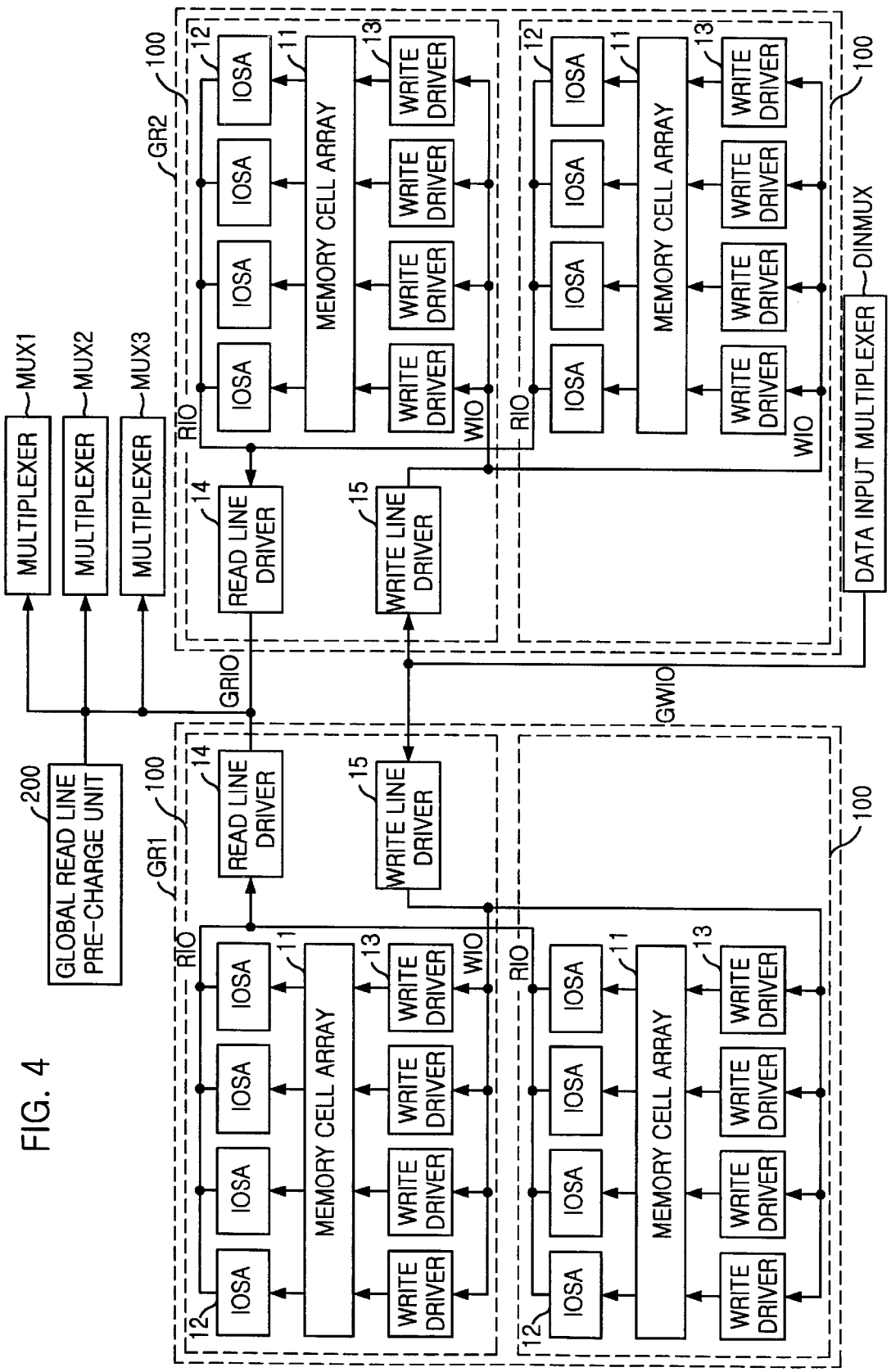
FIG. 4 presents a block diagram illustrating a structure of a memory device in accordance with another embodiment of the present invention.

FIG. 4 presents a block diagram illustrating the structure of the memory device in accordance with another embodiment of the present invention.

The memory banks are divided into a number of groups, each group including a number of memory banks. For illustration, there are shown two groups GR1 and GR2, each of which includes two memory banks. Each group includes the read line driver 14 and the write line driver 15 that are placed in only one memory bank within the group. The sense amplifiers 12 and the write drivers 13 in each group are connected to the read line driver 14 and the write line driver 15 in each of the group, respectively.

While the present invention has been described with respect to certain preferred embodiments only, other modifications and variations may be made without departing from the spirit and scope of the present invention as set forth in the following claims.

What is claimed is:

1. A semiconductor memory device for distributing load of input and output lines, comprising:
   a line pre-charging means for pre-charging a global read line composed of a pair of first lines to a high level in an initial or steady state;
   a plurality of memory banks connected to a global write line composed of a pair of second lines for storing data provided thereto, each memory bank including a memory cell array comprising a number of memory cells coupled to a multiplicity of sense amplifiers and a multiplicity of write drivers, wherein said multiplicity of amplifiers amplifies data signals from the memory cells to provide said data signals through a read line composed of a pair of third lines to a read line driver which provides said data signals on said read line to said global read line during a read operation, and wherein said multiplicity of write drivers are connected through a write line composed of a pair of fourth lines to said write line driver for storing the data on said global write line into the memory cells;
   a plurality of multiplexers for selecting the data from said global read line; and
   a data input means for providing external input data to said global write line during the write operation,
   wherein said read line driver includes:
   a pre-charge unit for pre-charging both of said second lines to the high level in the initial or standby state;
   a level detector for maintaining one of the pair of said second lines at a low level and the other of the pair of said second lines at the high level; and
   a output driver for providing the data on said read line to the global read line.

2. The semiconductor memory device as recited in claim 1, wherein said level detector includes a first and a second MOS transistor, which are connected together in series and have a common node connected to a reference voltage, a gate of the first transistor being coupled to one line of the pair of said third lines and a gate of the second transistor being coupled to the other line of the pair of said third lines, and wherein said output driver includes a first and a second inverter for inverting levels of signals on the pair of said third lines, respectively, and a third and a fourth MOS transistor respectively controlled by the first and the second inverters to provide the low or high level of signal to a respective one of the pair of first lines.

3. The semiconductor memory device as recited in claim 2, wherein said common node is coupled to a voltage source when said first and second MOS transistors are pMOS transistors and said third and fourth MOS transistors are nMOS transistors, and is grounded when said first and second MOS transistors are nMOS transistors and said third and fourth MOS transistors are pMOS transistors.

4. A semiconductor memory device for distributing load of input and output lines, comprising:
- a plurality of memory banks, including:
  - a plurality of memory cells, each memory cell coupled to a word line and a pair of local bit lines;
  - a plurality of sense amplifiers for reading out data stored in said memory cells; and
  - a plurality of write drivers for storing data in said memory cells;
- a pair of global read lines coupled to the plurality of sense amplifiers via a read line driver and a pair of read lines, the read line driver including means for detecting and maintaining a voltage level on each of said read lines at one of a low level and a high level;
- a pair of global write lines coupled to the plurality of write drivers via a write line driver and a pair of write lines; and
- a pre-charge means for pre-charging said global read lines to the high level in an initial or steady state of the semiconductor memory device.

5. The semiconductor memory device as recited in claim 4, further comprising an output driver for providing the data on said read lines to an external circuit via said global read lines.

* * * * *